(12) United States Patent
Ueda et al.

(10) Patent No.: US 9,293,695 B2
(45) Date of Patent: Mar. 22, 2016

(54) MAGNETORESISTIVE ELEMENT AND MAGNETIC RANDOM ACCESS MEMORY

(71) Applicants: Koji Ueda, Seoul (KR); Toshihiko Nagase, Seoul (KR); Kazuya Sawada, Seoul (KR); Youngmin Eeh, Seoul (KR); Daisuke Watanabe, Seoul (KR); Hiroaki Yoda, Seoul (KR)

(72) Inventors: Koji Ueda, Seoul (KR); Toshihiko Nagase, Seoul (KR); Kazuya Sawada, Seoul (KR); Youngmin Eeh, Seoul (KR); Daisuke Watanabe, Seoul (KR); Hiroaki Yoda, Seoul (KR)

( * ) Notice: Subject to any disclaimer, the term of this patent is extended or adjusted under 35 U.S.C. 154(b) by 116 days.

(21) Appl. No.: 14/160,166

(22) Filed: Jan. 21, 2014

(65) Prior Publication Data
US 2015/0070128 A1    Mar. 12, 2015

Related U.S. Application Data

(60) Provisional application No. 61/875,563, filed on Sep. 9, 2013.

(51) Int. Cl.
*H01L 43/00* (2006.01)
*H01L 43/08* (2006.01)
*H01L 27/22* (2006.01)

(52) U.S. Cl.
CPC .............. *H01L 43/08* (2013.01); *H01L 27/228* (2013.01)

(58) Field of Classification Search
CPC . H01L 43/08; H01L 27/222; H01L 29/66984; H01L 45/04; H01L 45/1608; H01L 29/82; G11B 5/3906; G11B 5/3909; G11B 2005/3996; G11B 5/3967; G11B 5/70621; G11B 5/708

USPC ........................................................ 338/32 R
See application file for complete search history.

(56) References Cited

U.S. PATENT DOCUMENTS

| 7,924,607 B2 * | 4/2011 | Yoshikawa et al. ........... 365/158 |
| 8,098,514 B2 * | 1/2012 | Nagase et al. ................. 365/158 |
| 8,299,552 B2 * | 10/2012 | Nagase et al. ................. 257/421 |
| 8,305,801 B2 * | 11/2012 | Daibou et al. ................. 365/171 |
| 2007/0121255 A1 | 5/2007 | Tsuchiya et al. |
| 2009/0027810 A1 * | 1/2009 | Horng et al. ................ 360/324.2 |

(Continued)

FOREIGN PATENT DOCUMENTS

| JP | 2007150183 A | 6/2007 |
| JP | 2010016408 A | 1/2010 |
| JP | 2013016644 A | 1/2013 |

OTHER PUBLICATIONS

International Search Report including Written Opinion dated Oct. 21, 2014, issued in parent International Application No. PCT/JP2014/069123.

*Primary Examiner* — Kyung Lee
(74) *Attorney, Agent, or Firm* — Holtz, Holtz & Volek PC (57) ABSTRACT

According to one embodiment, a magnetoresistive element comprises a first magnetic layer, a second magnetic layer, a first nonmagnetic layer, a second nonmagnetic layer, and a third magnetic layer. The first magnetic layer has a variable magnetization direction. The second magnetic layer has an invariable magnetization direction and includes a nonmagnetic material film and a magnetic material film. The first nonmagnetic layer is arranged between the first magnetic layer and the second magnetic layer. The second nonmagnetic layer is arranged on a surface of the second magnetic layer. The third magnetic layer is arranged on a surface of the second nonmagnetic layer. The second nonmagnetic layer is in contact with the nonmagnetic material film included in the second magnetic layer.

17 Claims, 4 Drawing Sheets

(56) References Cited

U.S. PATENT DOCUMENTS

| | | | |
|---|---|---|---|
| 2011/0143460 A1* | 6/2011 | Tsunekawa et al. | 438/3 |
| 2011/0228596 A1* | 9/2011 | Inokuchi et al. | 365/158 |
| 2012/0008381 A1* | 1/2012 | Nagase et al. | 365/158 |
| 2012/0068285 A1* | 3/2012 | Kitagawa et al. | 257/421 |
| 2012/0069640 A1* | 3/2012 | Nagase et al. | 365/158 |
| 2013/0001713 A1 | 1/2013 | Ueda et al. | |
| 2013/0010532 A1 | 1/2013 | Nagase et al. | |
| 2013/0099337 A1 | 4/2013 | Nakayama et al. | |
| 2013/0099338 A1 | 4/2013 | Nakayama et al. | |

* cited by examiner

MAGNETORESISTIVE ELEMENT AND MAGNETIC RANDOM ACCESS MEMORY

CROSS-REFERENCE TO RELATED APPLICATIONS

This application claims the benefit of U.S. Provisional Application No. 61/875,563, filed Sep. 9, 2013, the entire contents of which are incorporated herein by reference.

FIELD

Embodiments described herein relate generally to a magnetoresistive element and a magnetic random access memory.

BACKGROUND

Magnetic random access memories (MRAMs) in which the magnetoresistive effect of a ferromagnetic material is used have recently attracted interest as next-generation solid-state nonvolatile memories capable of speeding up read/write operations, increasing capacity, and realizing low-power operation. In particular, magnetoresistive elements including a ferromagnetic tunnel junction have received a great deal of attention since the finding of the ability of exhibiting a high rate of magnetoresistive change. The ferromagnetic tunnel junction has a three-layer structure including a storage layer having a variable magnetization direction, an insulating layer, and a fixed layer that faces the storage layer and maintains a predetermined magnetization direction.

A magnetoresistive element having the ferromagnetic tunnel junction is also called a magnetic tunnel junction (MTJ) element. A write method (spin transfer torque writing) using spin-momentum transfer (SMT) has been proposed for this magnetoresistive element.

DETAILED DESCRIPTION

Embodiments will now be described with reference to the accompanying drawing. In the following explanation, the same reference numerals denote structure members having the same functions and arrangements, and a repetitive explanation will be made only when necessary. The embodiments to be described below merely exemplify devices and methods for embodying the technical concepts of the embodiments, and the materials, shapes, structures, layouts, and the like of the components are not limited to those to be described below.

In general, according to one embodiment, a magnetoresistive element comprises a first magnetic layer, a second magnetic layer, a first nonmagnetic layer, a second nonmagnetic layer, and a third magnetic layer. The first magnetic layer has a variable magnetization direction. The second magnetic layer has an invariable magnetization direction and includes a nonmagnetic material film and a magnetic material film. The first nonmagnetic layer is arranged between the first magnetic layer and the second magnetic layer. The second nonmagnetic layer is arranged on a surface of the second magnetic layer opposite to a surface on which the first nonmagnetic layer is arranged. The third magnetic layer is arranged on a surface of the second nonmagnetic layer opposite to a surface on which the second magnetic layer is arranged. The second nonmagnetic layer is in contact with the nonmagnetic material film included in the second magnetic layer.

First Embodiment

A magnetoresistive element according to the first embodiment will be described.

[1] Structure of Magnetoresistive Element

Figure 1:
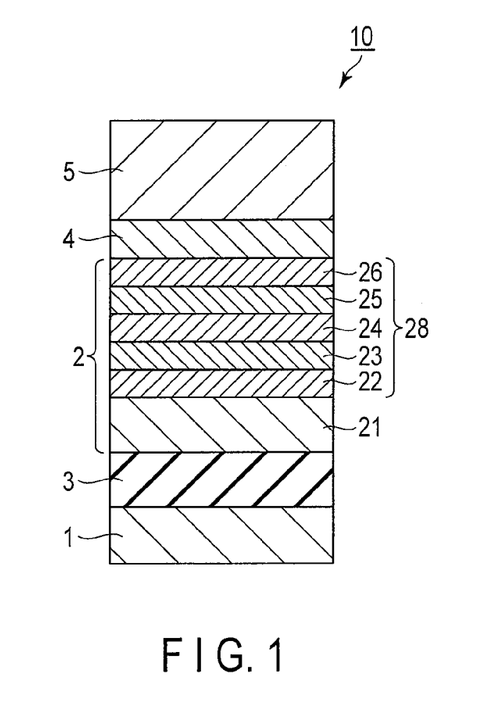
FIG. 1 is a sectional view showing the structure of a magnetoresistive element according to the first embodiment.

A magnetoresistive element in this specification indicates a magnetic tunnel junction (MTJ) element using a semiconductor or an insulator for a tunnel barrier layer. Sectional views from FIG. 1 illustrate the main part of a magnetoresistive element. However, the magnetoresistive element may include more layers as long as the illustrated arrangement is included.

FIG. 1 is a sectional view showing the structure of a magnetoresistive element according to the first embodiment.

A magnetoresistive element 10 performs a write by a spin transfer torque method. More specifically, the relative magnetization angle between a storage layer and a reference layer is changed to a parallel or antiparallel state (that is, minimum or maximum resistance) in accordance with the direction of a spin polarization current supplied to the layers in a direction perpendicular to the film surface. Each state is associated with binary 0 or 1, thereby storing data.

As shown in FIG. 1, the magnetoresistive element 10 includes at least a storage layer 1 that is a magnetic layer, a reference layer 2 that is a magnetic layer, and a nonmagnetic layer 3 provided between the storage layer 1 and the reference layer 2.

The storage layer 1 is provided on an underlayer (not shown). The storage layer 1 has easy axis in the membrane surface in the perpendicular direction, that is, the storage layer 1 has perpendicular magnetic anisotropy in the direction perpendicular or almost perpendicular to the film surface. The magnetization direction of the storage layer 1 is variable. "The magnetization direction is variable" means that the magnetization direction is different before and after a write. In this specification, "film surface" means the upper surface of a layer of interest. The storage layer 1 is also called a free layer, magnetization free layer, magnetization variable layer, or recording layer. The magnetization perpendicular to the film surface is called perpendicular magnetization.

The storage layer 1 has a structure in which, for example, a first storage layer (for example, a CoFeB layer), an inserted layer (for example, a W or Ta layer), and a second storage layer (for example, a CoFeB layer) are stacked.

The reference layer 2 has perpendicular magnetic anisotropy with the axis of easy magnetization in the direction perpendicular to the film surface, that is, in the direction perpendicular or almost perpendicular to the film surface. The magnetization direction of the reference layer 2 is invariable or fixed. "The magnetization direction is invariable" means that the magnetization direction is not different before and after a write. That is, the magnetization direction reversing energy barrier of the reference layer 2 is larger than that of the storage layer 1. The reference layer 2 is also called a fixed layer, magnetization fixed layer, pinned layer, reference layer, or magnetization reference layer.

The reference layer 2 has a structure in which an interface reference layer (for example, a CoFeB layer) 21 and an artificial lattice layer 28 are stacked on the nonmagnetic layer 3 in the order named. A spacer layer (nonmagnetic layer, for example, an Ru layer) 4 is formed on the reference layer 2. The structures of the reference layer 2 and the spacer layer 4 will be described later in detail.

The nonmagnetic layer 3 is also called a tunnel barrier layer and formed from an insulating film of an oxide or the like, for example, MgO. The nonmagnetic layer 3 will be referred to as a tunnel barrier layer hereinafter.

A shift cancellation layer 5 is formed on the spacer layer 4. The shift cancellation layer 5 includes an artificial lattice layer. The artificial lattice layer has a structure in which, for example, a magnetic material film (for example, a Co or Fe layer) and a nonmagnetic material film (for example, a Pt or Pd layer) are stacked on the spacer layer 4. The shift cancellation layer 5 relaxes and adjusts a shift of the reversing current of the storage layer 1 caused by a fringing field from the reference layer 2.

Although not illustrated, a cap layer and a hard mask are formed on the shift cancellation layer 5.

Note that any other names are usable if a structure can be regarded as substantially equal to that of the first embodiment.

The magnetoresistive element 10 according to the first embodiment shown in FIG. 1 has a so-called top pin structure in which the storage layer 1 is formed on the underlayer, and the tunnel barrier layer 3 and the reference layer 2 are formed on the storage layer 1. However, the first embodiment may use a so-called bottom pin structure in which the reference layer 2 is formed on the underlayer, and the tunnel barrier layer 3 and the storage layer 1 are formed on the reference layer 2.

Writing and reading in the magnetoresistive element 10 according to the first embodiment will briefly be described below.

The magnetoresistive element 10 is used for spin transfer torque writing. More specifically, at the time of a write, the current is supplied from the reference layer 2 to the storage layer 1 or from the storage layer 1 to the reference layer 2 in the direction perpendicular to the film surface, thereby injecting electrons having spin information from the reference layer 2 to the storage layer 1. When the spin angular momentum of the injected electrons is moved to the electrons in the storage layer 1 in accordance with the law of conservation of spin angular momentum, the magnetization of the storage layer 1 reverses.

For example, when the magnetization direction of the storage layer 1 and that of the reference layer 2 are in the antiparallel state, a current is supplied from the storage layer 1 to the reference layer 2. In this case, electrons flow from the reference layer 2 to the storage layer 1. At this time, the electrons whose spin is polarized by the reference layer 2 flow to the storage layer 1 via the tunnel barrier layer 3. The spin angular momentum is moved to the storage layer 1, and the magnetization direction of the storage layer 1 reverses and becomes parallel to the magnetization direction of the reference layer 2.

Conversely, when the magnetization direction of the storage layer 1 and that of the reference layer 2 are in the parallel state, a current is supplied from the reference layer 2 to the storage layer 1. In this case, electrons flow from the storage layer 1 to the reference layer 2. At this time, the electrons whose spin is polarized by the storage layer 1 flow to the reference layer 2 via the tunnel barrier layer 3. Electrons having a spin in the same direction as the magnetization direction of the reference layer 2 pass through the reference layer 2. However, electrons having a spin in a direction reverse to the magnetization direction of the reference layer 2 are reflected by the interface between the tunnel barrier layer 3 and the reference layer 2 and flow to the storage layer 1 via the tunnel barrier layer 3. Then, the spin angular momentum is moved to the storage layer 1, and the magnetization direction of the storage layer 1 reverses and becomes antiparallel to the magnetization direction of the reference layer 2.

Note that to read from the magnetoresistive element 10, a read current that does not reverse the magnetization direction of the storage layer 1 is supplied between the storage layer 1 and the reference layer 2 via the tunnel barrier layer 3. The magnetoresistive element 10 can thus be read.

[2] Structures of Reference Layer and Spacer Layer

The structures of the reference layer 2 and the spacer layer 4 according to this embodiment will be described below in detail.

As shown in FIG. 1, the reference layer 2 is formed on the tunnel barrier layer 3, and the spacer layer 4 is formed on the reference layer 2.

The reference layer 2 has a structure in which the interface reference layer (for example, a CoFeB layer) 21 and the artificial lattice layer 28 are stacked on the tunnel barrier layer 3 in the order named. The artificial lattice layer 28 has a structure in which, for example, a nonmagnetic material film (for example, a Pt or Pd layer) 22, a magnetic material film (for example, a Co or Fe layer) 23, a nonmagnetic material film (for example, a Pt or Pd layer) 24, a magnetic material film (for example, a Co or Fe layer) 25, and a nonmagnetic material film (for example, a Pt or Pd layer) 26 are stacked on the interface reference layer 21 in the order named.

The spacer layer (for example, an Ru layer) 4 that is a nonmagnetic layer is formed on the nonmagnetic material film 26. The nonmagnetic material film 26 is in contact with the spacer layer 4. The spacer layer 4 can be either thicker or thinner than the nonmagnetic material film 26. The shift cancellation layer 5 is formed on the spacer layer 4. The nonmagnetic material film 26 and the spacer layer 4 are made of different materials.

Note that the artificial lattice layer 28 included in the reference layer 2 need not always include the five films 22 to 26, and the number of stacked films may be more than five.

In the first embodiment, as shown in FIG. 1, the nonmagnetic material film (for example, a Pt layer) 26 is arranged under the spacer layer (nonmagnetic layer, Ru layer) 4. That is, the structure in which the nonmagnetic material film 26 included in the reference layer 2 is in contact with the spacer layer 4 is formed. This allows the reference layer 2 to be thin. Since this can reduce the fringing field from the reference layer 2, the shift cancellation layer 5 can also be made thin. In addition, since the number of steps of depositing the magnetic films (for example, Co layers) included in the reference layer 2 can be decreased, the manufacturing process of the magnetoresistive element 10 can be simplified, and the reversing current for reversing the magnetization of the storage layer 1 in the magnetoresistive element 10 can be made small.

Second Embodiment

In the first embodiment, an example has been described in which the spacer layer (Ru layer) is arranged on the nonmagnetic layer (Pt layer) of the reference layer 2. In the second embodiment, an example will be described in which a reference layer 2 contains an alloy of a magnetic material and a nonmagnetic material, and a spacer layer 4 is arranged on the alloy. The rest of the structure of a magnetoresistive element 20 shown in FIG. 2 is the same as in the first embodiment, and a description thereof will be omitted.

[1] Structures of Reference Layer and Spacer Layer

The structures of the reference layer 2 and the spacer layer 4 according to the second embodiment will be described in detail.

Figure 2:
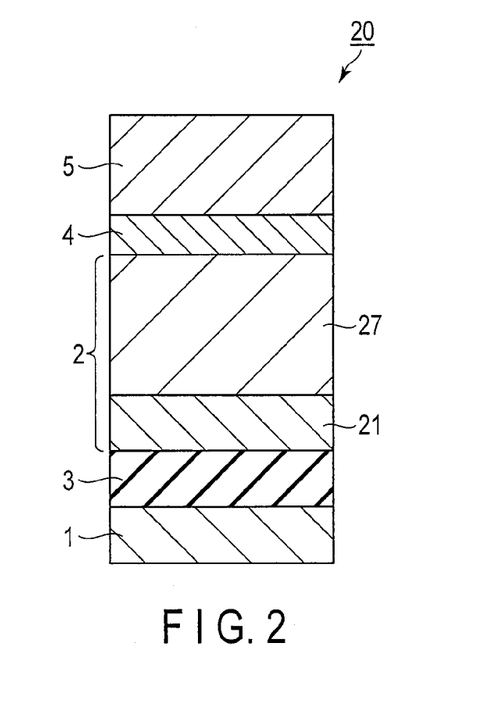
FIG. 2 is a sectional view showing the structure of a magnetoresistive element according to the second embodiment.

FIG. 2 is a sectional view showing the structure of the magnetoresistive element according to the second embodiment.

As shown in FIG. 2, the reference layer 2 is formed on a nonmagnetic layer 3, and the spacer layer 4 is formed on the reference layer 2.

The reference layer 2 has a structure in which an interface reference layer (for example, a CoFeB layer) 21 and an alloy layer 27 are stacked on the tunnel barrier layer 3 in the order named. The alloy layer 27 is made of an alloy containing a magnetic material and a nonmagnetic material. For example, the magnetic material contains at least one of Co and Fe, and the nonmagnetic material contains at least one of Pt and Pd.

The spacer layer 4 that is a nonmagnetic layer is formed on the alloy layer 27. The alloy layer 27 includes an upper region on the side of the spacer layer 4 and a lower region on the side of the tunnel barrier layer 3. The upper region of the alloy layer 27 is in contact with the spacer layer 4. The content of the magnetic material in the upper region of the alloy layer 27 is smaller than the stoichiometric composition. For example, when the alloy layer 27 is made of a Co—Pt alloy, the content of Co in the upper region is smaller than the stoichiometric composition.

Additionally, the content of the magnetic material can be smaller, and the content of the nonmagnetic material can be larger in the upper region of the alloy layer 27 than in the lower region. For example, when the alloy layer 27 is made of Co—Pt alloy, the content of Co is smaller, and the content of Pt is larger in the upper region than in the lower region. The alloy layer 27 may gradually reduce the content of Co from the side of the tunnel barrier layer 3 to the side of the spacer layer 4. For example, the content of Co of the alloy layer 27 may change stepwise or continuously from the side of the tunnel barrier layer 3 to the side of the spacer layer 4.

A shift cancellation layer 5 is formed on the spacer layer 4.

In the second embodiment, as shown in FIG. 2, the structure in which the reference layer 2 uses the alloy layer (for example, a Co—Pt layer) 27, and the upper region of the alloy layer 27 having a small content of the magnetic material is in contact with the spacer layer 4 is formed. This allows the reference layer 2 to be thin while maintaining the magnetic characteristic necessary for the reference layer 2. In addition, since the fringing field from the reference layer 2 can be reduced, the shift cancellation layer 5 can also be made thin. Furthermore, since the number of steps of forming the reference layer 2 can be decreased, the manufacturing process of the magnetoresistive element 20 can be simplified, and the reversing current for reversing the magnetization of a storage layer 1 in the magnetoresistive element 20 can be made small.

Third Embodiment

In the third embodiment, a magnetic random access memory (MRAM) will be described. The MRAM according to the third embodiment has an arrangement using the magnetoresistive element of the first or second embodiment as a memory element.

An example of the basic arrangement of the MRAM according to the third embodiment will be described with reference to FIGS. 3, 4, and 5.

Figure 3:
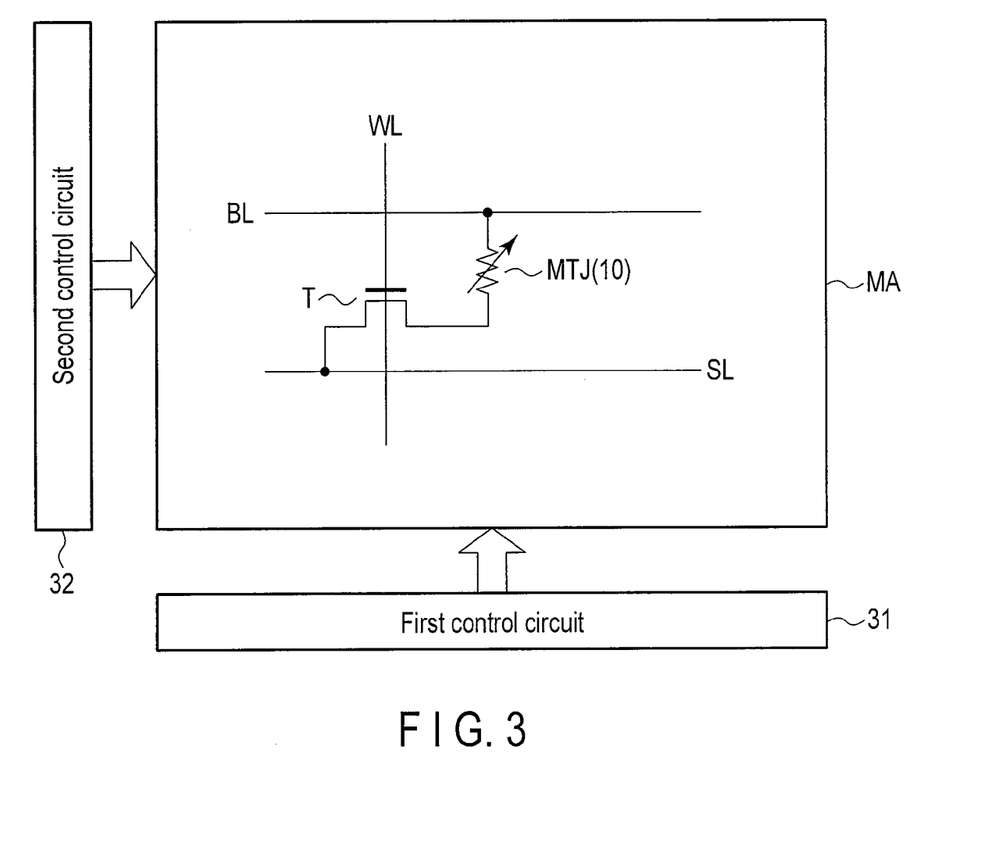
FIG. 3 is a circuit diagram showing the memory cell array of an MRAM according to the third embodiment.

FIG. 3 is a circuit diagram showing the memory cell array of the MRAM according to the third embodiment.

As shown in FIG. 3, each memory cell in a memory cell array MA includes a series connection body of a magnetoresistive element 10 and a switch element T. One terminal of the series connection body (one terminal of the magnetoresistive element 10) is electrically connected to a bit line BL. The other terminal of the series connection body (one terminal of the switch element T) is electrically connected to a source line SL. The switch element T includes a select transistor using, for example, an n-channel metal semiconductor field-effect transistor (MOSFET). The control terminal of the switch element T, for example, the gate electrode of the select transistor is electrically connected to a word line WL.

A first control circuit 31 controls the potential of the word line WL. A second control circuit 32 controls the potential of the bit line BL and the source line SL.

Figure 4:
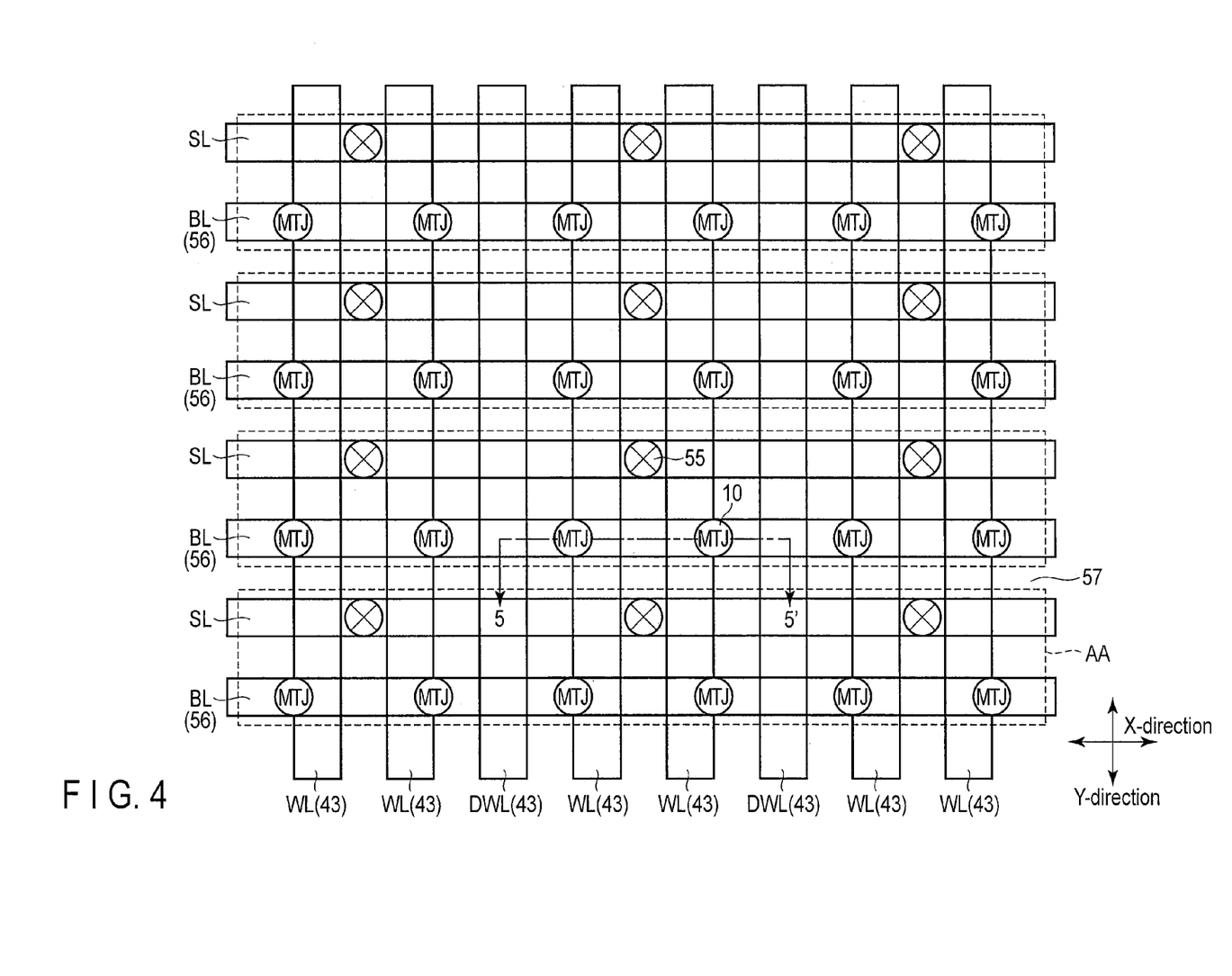
FIG. 4 is a plan view showing the memory cell array of the MRAM according to the third embodiment.

FIG. 4 is a plan view showing the memory cell array of the MRAM according to the third embodiment. FIG. 5 is a sectional view taken along line 5-5' in FIG. 4. FIG. 5 illustrates not only the section of the magnetoresistive element 10 but also the section of a source line contact 55.

Figure 5:
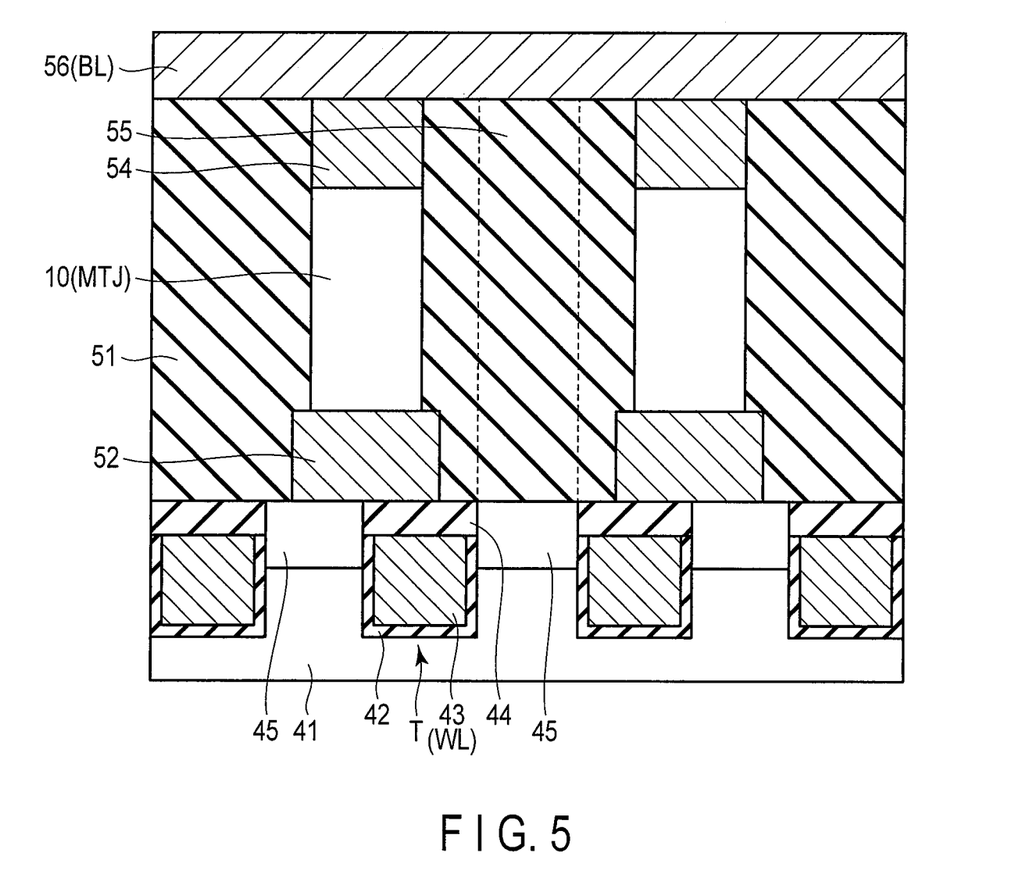
FIG. 5 is a sectional view taken along line 5-5' of the memory cell array according to the third embodiment.

As shown in FIGS. 4 and 5, for example, a plurality of word lines WL and a plurality of dummy word lines DWL extending in the Y-direction and a plurality of bit lines BL and a plurality of source lines SL extending in the X-direction perpendicular to the Y-direction are arranged in the memory cell array MA. Two word lines WL and one dummy word line DWL are alternately arranged along the X-direction. The bit lines BL and the source lines SL are alternately arranged along the Y-direction.

In the memory cell array MA, an element isolation insulating layer extending in the X-direction is provided in the surface region of a p-semiconductor substrate (for example, a silicon substrate) 41. The region serves as an element isolation region 57. A region where the element isolation insulating layer is not provided out of the surface region of the semiconductor substrate 41 serves as an active area AA. That is, the element isolation region 57 and the active area AA are alternately arranged along the Y-direction. The element isolation insulating layer is formed by, for example, shallow trench isolation (STI). For example, an insulating material such as silicon nitride (SiN) having a high burying characteristic is used as the element isolation insulating layer.

A select transistor using, for example, an n-channel MOSFET is provided on the semiconductor substrate 41 as the switch element T. The select transistor has a structure in which a recess is formed in the semiconductor substrate 41, and a gate electrode 43 containing, for example, polysilicon is buried in the recess.

More specifically, the switch element (select transistor) T includes a gate insulating layer 42, the gate electrode 43, and two diffusion layers (drain-side diffusion layer and source-side diffusion layer) 45.

The gate insulating layer 42 is formed on the lower inner surface of the recess formed in the surface of the semiconductor substrate 41 and extending in the Y-direction. The gate electrode 43 is formed on the inner surface of the gate insulating layer 42 to fill the lower portion of the recess. The gate electrode 43 corresponds to the word line WL. An insulating layer 44 made of, for example, SiN is formed on the upper surfaces of the gate insulating layer 42 and the gate electrode 43 to fill the upper portion of the recess. The upper surface of the insulating layer 44 is almost flush with the upper surface of the semiconductor substrate 41 (the upper surfaces of the diffusion layers 45).

The two diffusion layers 45 are formed in the surface of the semiconductor substrate 41 so as to sandwich the gate insulating layer 42, the gate electrode 43, and the insulating layer 44. The diffusion layer 45 located between two memory cells adjacent along the X-direction is shared by the two adjacent memory cells. On the other hand, the diffusion layers 45 are isolated along the Y-direction by the element isolation regions 57, although not shown. In other words, the diffusion layers 45 of two memory cells adjacent along the Y-direction become adjacent via the element isolation region 57. That is, the diffusion layers 45 are located outside the formation regions of the gate insulating layers 42, the gate electrodes 43, and the insulating layers 44 in the active area AA. An interlayer dielectric film 51 is formed on the semiconductor substrate 41 (on the insulating layer 44 and the diffusion layer 45).

A lower electrode 52, the magnetoresistive element 10, and an upper electrode 54 are sequentially formed in the interlayer dielectric film 51 on one diffusion layer (drain-side diffusion layer) 45.

More specifically, the lower electrode 52 is formed in contact with part of the upper surface of one diffusion layer (drain-side diffusion layer) 45 and part of the upper surface of the insulating layer 44. In other words, the lower electrode 52 and the diffusion layer 45 partially overlap on a plane. This is because the lower electrode 52 and the diffusion layer 45 (recess) are formed by different processing methods. The lower electrode 52 has, for example, a square planar shape. The lower electrode 52 contains, for example, TiN. However, the present invention is not limited to this.

The magnetoresistive element 10 is formed in contact with the upper surface of the lower electrode 52. The magnetoresistive element 10 has, for example, a circular planar shape and is formed into a cylindrical shape. In other words, the magnetoresistive element 10 and the lower electrode 52 overlap on a plane. The planar area of the magnetoresistive element 10 is preferably smaller than that of the lower electrode 52. This makes it possible to bring the entire lower surface of the magnetoresistive element 10 into contact with the upper surface of the lower electrode 52 and reduce the contact resistance between them.

As shown in FIG. 5, the upper electrode 54 is formed in contact with the upper surface of the magnetoresistive element 10. The bit line BL is formed in contact with the upper surface of the upper electrode 54. That is, the upper electrode 54 serves as a bit line contact.

The source line contact 55 is formed in the interlayer dielectric film 51 on the other diffusion layer (source-side diffusion layer) 45. The source line contact 55 is formed in contact with the upper surface of the other diffusion layer 45. The source line SL is formed in contact with the upper surface of the source line contact 55. The other diffusion layer 45 and the source line contact 55 are shared by two adjacent memory cells.

Note that out of three gate electrodes 43 adjacent in the X-direction, two gate electrodes 43 are electrically connected to the magnetoresistive element 10 and correspond to the word lines WL, and one gate electrode 43 is not electrically connected to the magnetoresistive element 10 and corresponds to the dummy word line DWL.

As described above, according to the embodiments, the spacer layer is arranged on the nonmagnetic layer included in the reference layer. Alternatively, an alloy of a magnetic material and a nonmagnetic material is used in the reference layer, and the spacer layer is arranged on the upper region having a small content of the magnetic material. This allows the reference layer to be thin while maintaining the magnetic characteristic necessary for the reference layer. In addition, since the fringing field from the reference layer can be reduced, the shift cancellation layer can also be made thin. It is therefore possible to decrease the thickness of the magnetoresistive element.

Each of above described MTJ structures can be introduced as MTJ elements of memory cells. Memory cells, memory cell arrays and memory devices is disclosed in U.S. patent application Ser. No. 13/420,106 (Asao), the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
   a first magnetic layer having a variable magnetization direction;
   a second magnetic layer having an invariable magnetization direction and including a nonmagnetic material film and a magnetic material film;
   a first nonmagnetic layer arranged between the first magnetic layer and the second magnetic layer;
   a second nonmagnetic layer arranged on a surface of the second magnetic layer opposite to a surface on which the first nonmagnetic layer is arranged; and
   a third magnetic layer arranged on a surface of the second nonmagnetic layer opposite to a surface on which the second magnetic layer is arranged,
   wherein the second nonmagnetic layer is in contact with the nonmagnetic material film included in the second magnetic layer.

2. The magnetoresistive element according to claim 1, wherein the second nonmagnetic layer and the nonmagnetic material film are made of different materials.

3. The magnetoresistive element according to claim 1, wherein the second magnetic layer includes an artificial lattice layer in which the nonmagnetic material film and the magnetic material film are stacked.

4. The magnetoresistive element according to claim 1, wherein the nonmagnetic material film contains at least one material selected from the group including Pt and Pd.

5. The magnetoresistive element according to claim 1, wherein the magnetic material film contains at least one material selected from the group including Co and Fe.

6. The magnetoresistive element according to claim 1, wherein the second nonmagnetic layer contains at least one material selected from the group including Ru, Ta, W, Zr, Nb, Mo, and Hf.

7. The magnetoresistive element according to claim 1, wherein the second nonmagnetic layer is thicker than the nonmagnetic material film.

8. The magnetoresistive element according to claim 1, wherein the second nonmagnetic layer is thinner than the nonmagnetic material film.

9. The magnetoresistive element according to claim 1, wherein the third magnetic layer includes an artificial lattice layer in which a nonmagnetic material film and a magnetic material film are stacked.

10. The magnetoresistive element according to claim 9, wherein the nonmagnetic material film contains at least one material selected from the group including Pt and Pd.

11. The magnetoresistive element according to claim 9, wherein the magnetic material film contains at least one material selected from the group including Co and Fe.

12. A magnetoresistive element comprising:
- a first magnetic layer having a variable magnetization direction;
- a second magnetic layer having an invariable magnetization direction and containing an alloy of a magnetic material and a nonmagnetic material;
- a first nonmagnetic layer arranged between the first magnetic layer and the second magnetic layer;
- a second nonmagnetic layer arranged on a surface of the second magnetic layer opposite to a surface on which the first nonmagnetic layer is arranged; and
- a third magnetic layer arranged on a surface of the second nonmagnetic layer opposite to a surface on which the second magnetic layer is arranged,
- wherein the second nonmagnetic layer is in contact with an upper region of the alloy, and a content of the magnetic material in the upper region is smaller than a stoichiometric composition.

13. The magnetoresistive element according to claim 12, wherein a content of the magnetic material is smaller in the upper region of the alloy than in a lower region of the alloy on a side of the first nonmagnetic layer.

14. The magnetoresistive element according to claim 12, wherein a content of the magnetic material of the alloy gradually decreases from a side of the first nonmagnetic layer to a side of the second nonmagnetic layer.

15. The magnetoresistive element according to claim 12, wherein the nonmagnetic material contains at least one material selected from the group including Pt and Pd.

16. The magnetoresistive element according to claim 12, wherein the magnetic material contains at least one material selected from the group including Co and Fe.

17. The magnetoresistive element according to claim 12, wherein the second nonmagnetic layer contains at least one material selected from the group including Ru, Ta, W, Zr, Nb, Mo, and Hf.

* * * * *